US008861227B2

(12) United States Patent
Manion et al.

(10) Patent No.: US 8,861,227 B2
(45) Date of Patent: Oct. 14, 2014

(54) SMART METER PROTECTION SYSTEM AND METHODS

(75) Inventors: Holly Ellen Manion, Rancho Santa Fe, CA (US); Alfredo Rodriguez Pacheco, Jr., Encinitas, CA (US); John O'Melveny Woods, Kirkland, WA (US); James Joseph Fraley, Encinitas, CA (US)

(73) Assignee: EMF Safety, LLC, Rancho Sante Fe, CA (US)

( * ) Notice: Subject to any disclaimer, the term of this patent is extended or adjusted under 35 U.S.C. 154(b) by 602 days.

(21) Appl. No.: 13/195,304

(22) Filed: Aug. 1, 2011

(65) Prior Publication Data

US 2012/0026715 A1 Feb. 2, 2012

Related U.S. Application Data

(60) Provisional application No. 61/370,013, filed on Aug. 2, 2010, provisional application No. 61/382,848, filed on Sep. 14, 2010.

(51) Int. Cl.
*H05K 9/00* (2006.01)
*G01D 11/24* (2006.01)
*H01R 4/64* (2006.01)
*G01R 1/18* (2006.01)

(52) U.S. Cl.
CPC .. *H01R 4/64* (2013.01); *G01R 1/18* (2013.01); *G01D 11/24* (2013.01); *H05K 9/00* (2013.01)
USPC ........................................... 361/816; 174/520

(58) Field of Classification Search
CPC ....... H05K 9/00; H05K 9/002; H05K 9/0039; H05K 1/0218
USPC ........................................... 361/816; 174/520
See application file for complete search history.

(56) References Cited

U.S. PATENT DOCUMENTS

| 4,491,792 | A | 1/1985 | Bullock et al. |
| 5,027,061 | A * | 6/1991 | Palmer et al. ................. 324/156 |
| 6,462,713 | B2 | 10/2002 | Porter et al. |
| 7,019,666 | B2 | 3/2006 | Tootoonian Mashhad et al. |
| 7,550,826 | B2 | 6/2009 | Orth et al. |
| 8,427,317 | B2 * | 4/2013 | Hammad et al. ........... 340/572.1 |
| 2008/0068216 | A1 | 3/2008 | Borisov et al. |
| 2008/0129536 | A1 | 6/2008 | Randall et al. |
| 2010/0164750 | A1 | 7/2010 | Mashhad et al. |
| 2010/0201516 | A1 | 8/2010 | Gelvin et al. |

OTHER PUBLICATIONS

Weatherall, "The Dangers of Smart Meters," Feb. 10, 2010, submitted by applicant and contained in file wrapper.*

(Continued)

*Primary Examiner* — Timothy Thompson
*Assistant Examiner* — Charles Pizzuto
(74) *Attorney, Agent, or Firm* — Stephen C. Beuerle; Procopio Cory Hargreaves & Savitch LLP

(57) ABSTRACT

A smart meter protection system for decreasing intensity of radiation going into an interior of a building structure, living area, or where people frequent from a smart meter includes a redirection mechanism operably associable with the smart meter to substantially enclose an outer surface area of the smart meter so as to redirect radiation emitted from the smart meter away from the interior of the building structure, living area, or where people frequent.

18 Claims, 16 Drawing Sheets

(56) References Cited

OTHER PUBLICATIONS

Sander Keemink, Bart Roos, Security analysis of Dutch smart metering system, Universiteit Van Amsterdam, Jul. 7, 2008.
The Danger of Smart Meters, weepnews.blogspot.com, Feb. 5, 2010.
JCM, RF shield around meters, mercurynewsforum.com, Sep. 7, 2010.
weepinitiative.org. The Danger of 'Smart Meters'/Propertyvalues/Dangerous/Alarmingreport/Cell Phone Cigarerrettes, http://weepnews.blogspot.com/2010/02/danger-of-meters-property-values.html, Feb. 5, 2010, 15 pages.
Smart Meter Shield Trademark, filed Jul. 23, 2010, 3 pages.
Mercury News. Readers: SmartMeters interfere with baby monitors, other household gadgets, http://forums.mercurynews.com/topic/readers-smartmeters-interfere-with-baby-monitors-other-household-gadgets, Sep. 7, 2010, 6 pages.

\* cited by examiner

SMART METER PROTECTION SYSTEM AND METHODS

CROSS-REFERENCE TO RELATED APPLICATION

This application claims priority to U.S. provisional patent application 61/370,013 filed on Aug. 2, 2010 and 61/382,848 filed on Sep. 14, 2010, under 35 U.S.C. 119. The provisional patent applications are incorporated by reference herein.

FIELD OF THE INVENTION

The present invention relates to Faraday shields, especially Faraday shields for smart meters.

BACKGROUND OF THE INVENTION

A smart meter is a digital electric, water, or gas meter that records consumption in intervals and communicates the information via a communications network back to a utility company for monitoring and billing purposes (e.g., telemetering). The smart meter uses wireless technology for communicating with the utility company. The smart meter can also shut off or suspend the delivery of these services, under any condition. The smart meter can also services load balancing, emergency, etc.

SUMMARY OF THE INVENTION

An aspect of the present invention involves a smart meter protection system that provides a Faraday shield: which redirects the radio frequency (RF) energy away from the living area, decreasing the intensity of the radiation going into one's home from the smart meter and protecting the occupants of the home from the majority of RF radiation emitted from the smart meter while allowing the smart meter to perform its telemetering or communication functions. The described solution is an example of an invention where many of these components that make up this system can be used in concert or as a single component. When the solution is implemented where every component is working in concert with each other the benefits are maximized. However, utilizing a single component, e.g. the focusing unit alone with the smart meter as a Faraday shield), can also provide a beneficial outcome.

Another aspect of the present invention involves a smart meter protection system that includes a focuser unit that circumferentially cuffs the smart meter. The focuser unit focuses emitted RF energy and, along with the rest of the smart meter protection system, decreases the intensity of the RF radiation being emitted by the smart meter into the living area.

A further aspect of the invention involves a smart meter protection system for decreasing the intensity of the radiation and the RF pulse energy going into an interior of a building structure, living area, or where people frequent from a smart meter and protecting the occupants from the majority of RF radiation emitted from the smart meter while allowing the smart meter to perform its telemetering or communication functions. The smart meter protection system includes a redirection mechanism operably associable with the smart meter to substantially enclose an outer surface area of the smart meter so as to redirect radiation emitted from the smart meter away from the interior of the building structure, living area, or where people frequent.

One or more implementations of the aspect of the invention described immediately above includes one or more of the following: the redirection mechanism includes at least one of a smart meter protection device, a smart meter protection panel, and a focuser unit; the redirection mechanism includes a smart meter protection device; the smart meter protection device includes an enclosure like but not limited to a rectangular box configuration; the smart meter protection device includes four closed sides and two open sides; one of the two open sides accommodates the smart meter and the other of the two open sides allows redirected radiation to egress there through away from the interior of the building structure, living area, or where people frequent; the smart meter protection device includes at least one opening that allows redirected radiation to egress there through away from the interior of the building structure, living area, or where people frequent; the redirection mechanism includes a smart meter protection device and a smart meter protection panel; the smart meter protection panel is operably associable with the smart meter between the smart meter and the interior of the building structure, living area, or where people frequent to redirect the radiation emitted from the smart meter away from the interior of the building structure, living area, or where people frequent; the redirection mechanism includes a smart meter protection device, a smart meter protection panel, and a focuser unit; the redirection mechanism includes a focuser unit; the redirection mechanism is a focuser unit; the smart meter includes an outer periphery and the focuser unit is a band that is operably associable with the smart meter for directly surrounding the outer periphery of the smart meter in a ring-like fashion; the band includes two open ends, and one of the two open ends accommodates the smart meter and the other of the two open ends allows redirected radiation to egress there through away from the interior of the building structure, living area, or where people frequent; the focuser unit includes at least one opening that allows redirected radiation to egress there through away from the interior of the building structure, living area, or where people frequent; and/or the smart meter protection system includes grounding wire(s) to ground the smart meter protection system.

A still further aspect of the invention involves a method of using a smart meter protection system for decreasing the intensity of the radiation going into an interior of a building structure, living area, or where people frequent from a smart meter and protecting the occupants from the majority of RF radiation emitted from the smart meter while allowing the smart meter to perform its telemetering or communication functions. The smart meter protection system includes a redirection mechanism operably associable with the smart meter to substantially enclose an outer surface area of the smart meter so as to redirect radiation emitted from the smart meter away from the interior of the building structure, living area, or where people frequent.

The method includes providing the smart meter protection system described in the aspect of the invention described above; operably associating the smart meter protection system with the smart meter so that smart meter protection system substantially encloses the outer surface area of the smart meter; and redirecting radiation emitted from the smart meter away from the interior of the building structure, living area, or where people frequent with the smart meter protection system.

One or more implementations of the aspect of the invention described immediately above includes one or more of the following: the redirection mechanism includes a smart meter protection device, and operably associating includes operably associating the smart meter protection device with the smart meter so that smart meter protection device substantially encloses the outer surface area of the smart meter and redirects radiation emitted from the smart meter away from the interior of the building structure, living area, or where people frequent; the redirection mechanism includes a smart meter protection panel, and operably associating includes operably associating the smart meter protection panel with the smart meter between the smart meter and the interior of the building structure, living area, or where people frequent so that smart meter protection panel redirects the radiation emitted from the smart meter away from the interior of the building structure, living area, or where people frequent and/or the smart meter includes an outer periphery and the redirection mechanism includes a focuser unit that is a band, and operably associating includes directly surrounding the outer periphery of the smart meter in a ring-like fashion with the focuser unit so that the focuser unit substantially encloses the outer surface area of the smart meter and redirects radiation emitted from the smart meter away from the interior of the building structure, living area, or where people frequent.

DETAILED DESCRIPTION OF PREFERRED EMBODIMENTS

Figure 1:
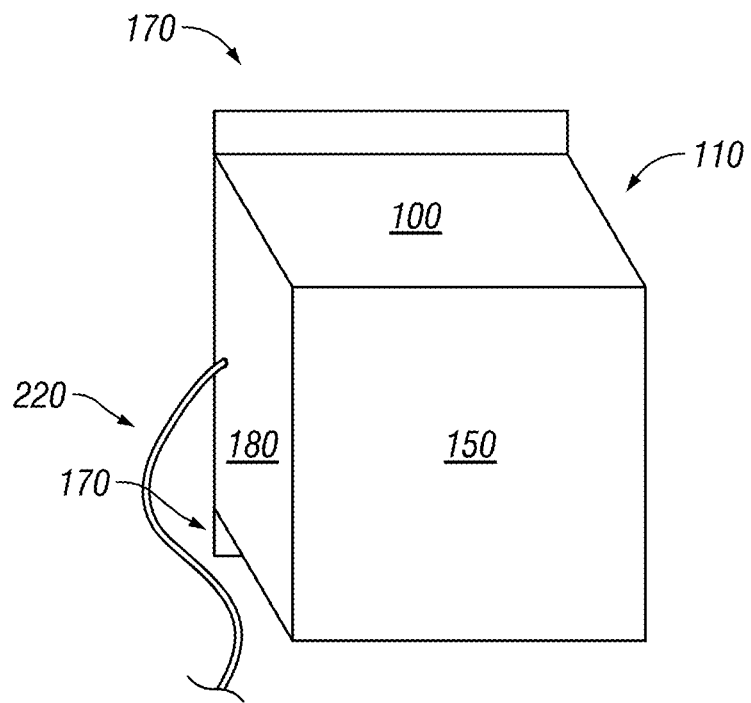
FIG. 1 is a perspective view of a smart meter protection device.
Figure 2:
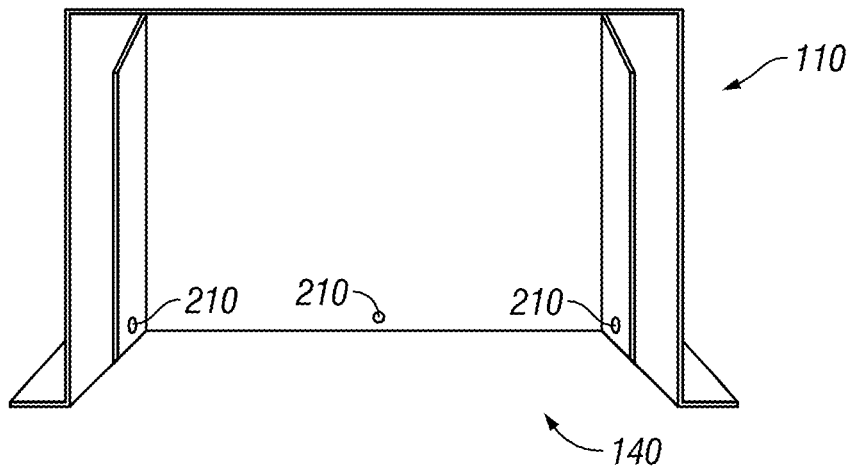
FIG. 2 is a front elevation view of the smart meter protection device of FIG. 1.
Figure 3:
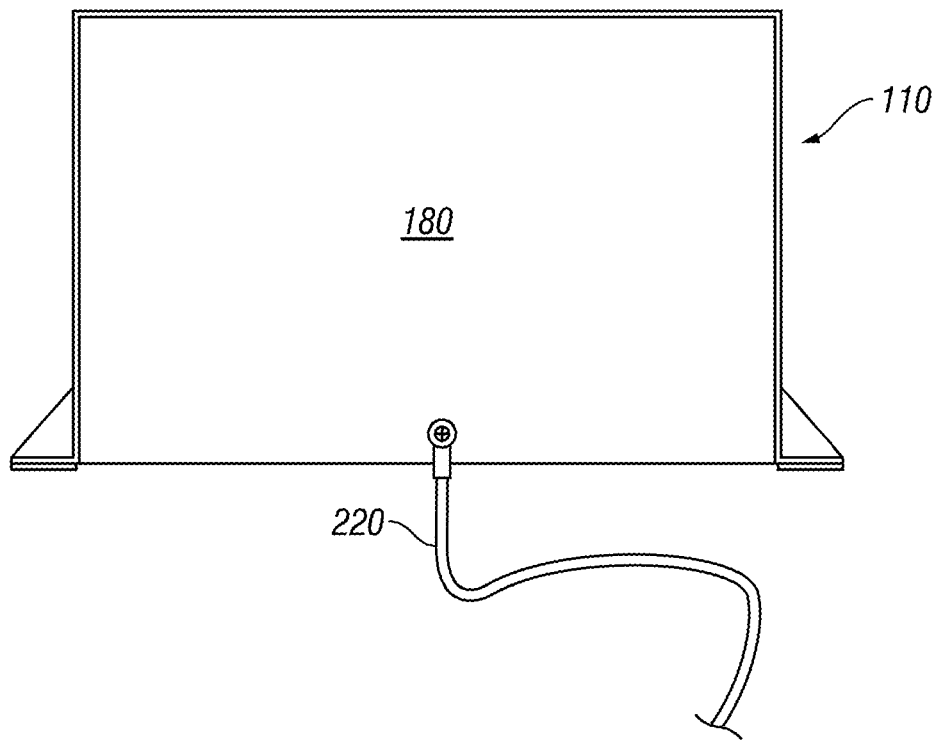
FIG. 3 is a rear elevation view of the smart meter protection device of FIG. 1.
Figure 4:
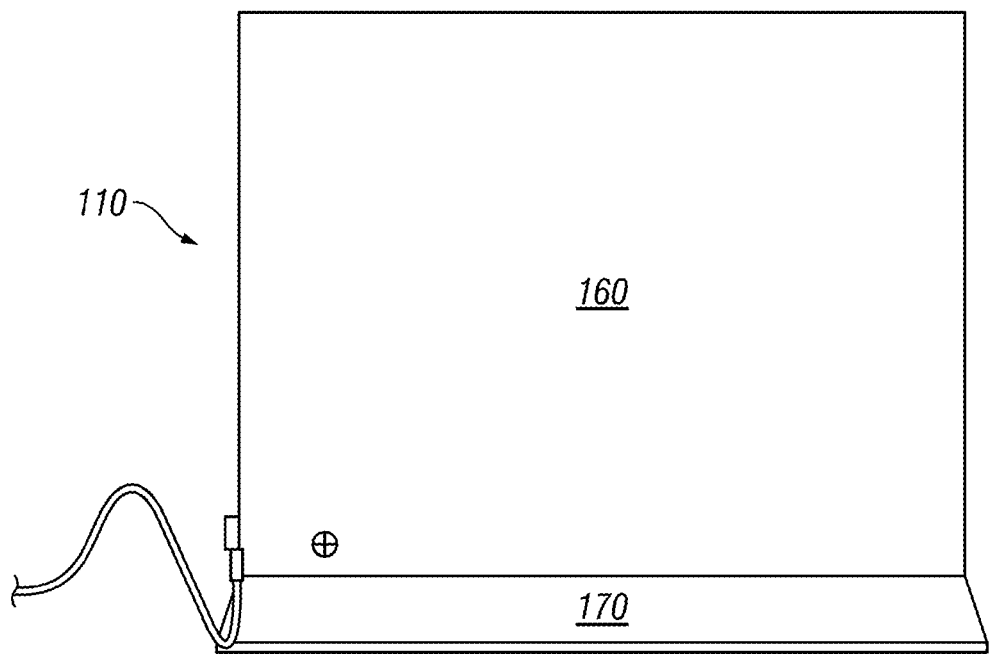
FIG. 4 is a left side elevation view of the smart meter protection device of FIG. 1.
Figure 5:
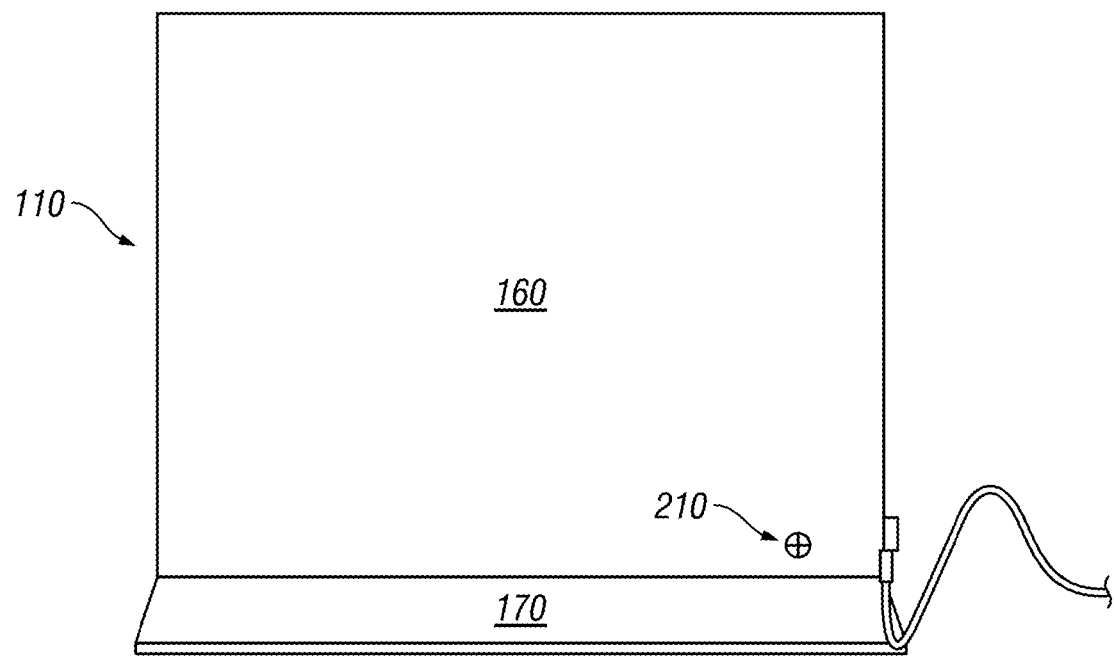
FIG. 5 is a right side elevation view of the smart meter protection device of FIG. 1.
Figure 6:
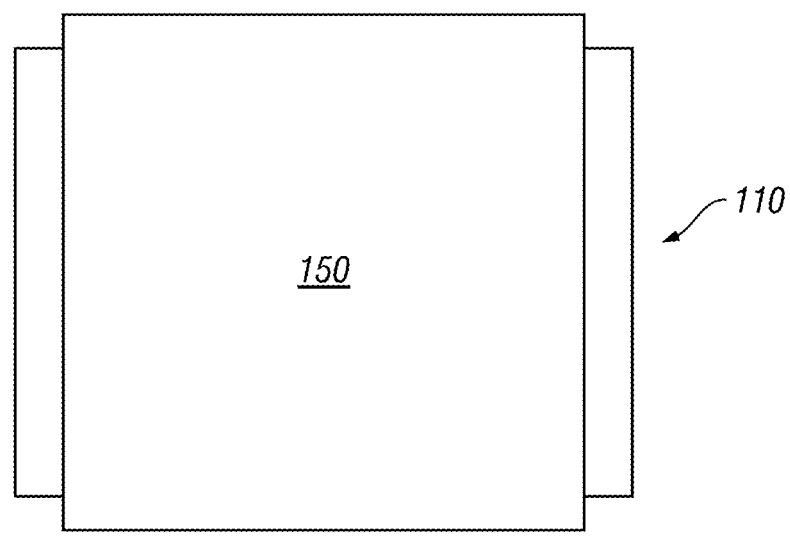
FIG. 6 is a top plan view of the smart meter protection device of FIG. 1.
Figure 7:
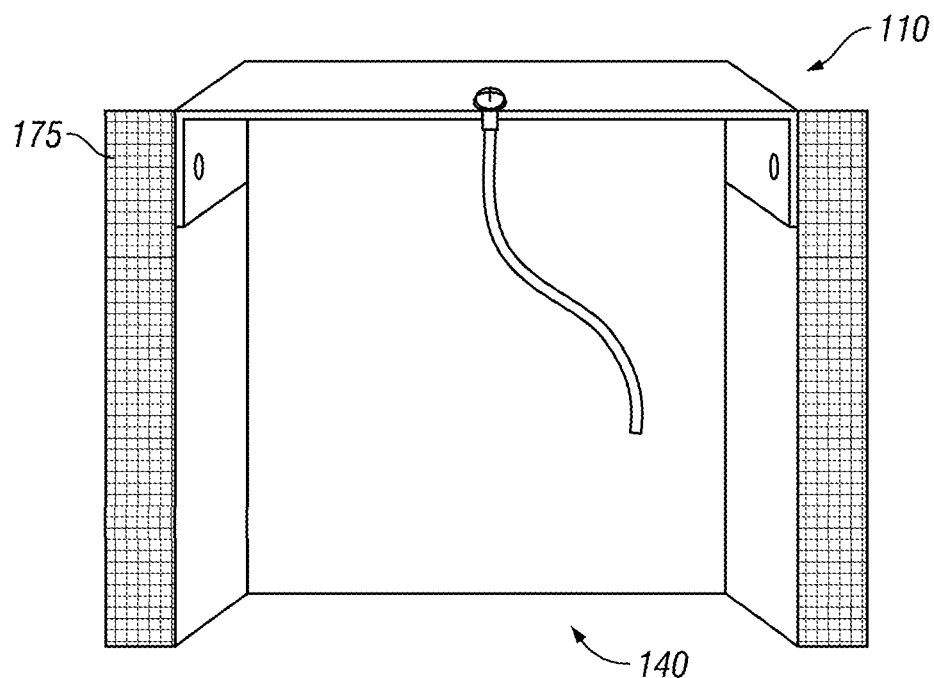
FIG. 7 is a bottom plan view of the smart meter protection device of FIG. 1.

With reference to FIGS. 1-23, an embodiment of a smart meter protection system 100, along with methods of making, applying, and using the smart meter protection system 100, will be described. The smart meter protection system 100 provides a Faraday cage, Faraday shield or Hoffman Box for a smart meter 105. As will be shown and described in more detail herein, the smart meter protection system 100 includes one or more redirection mechanisms (smart meter protection device 110, smart meter protection panel 120, and/or focuser unit 320) operably associable with the smart meter 105 to substantially enclose an outer surface area 106 of the smart meter 105 so as to redirect radiation emitted from the smart meter 105 away from the interior of the building structure, living area, or where people frequent. As used herein, "substantially enclose" means to enclose over 50% of the exterior surface area 106 of the smart meter 105. The smart meter protection system 100 redirects and absorbs some of the unwanted RF radiation emitted by the smart meter 105, decreasing the intensity of the radiation going into one's home from the smart meter and protecting the occupants of the home from the majority of RF radiation emitted from the smart meter while allowing the smart meter to perform its telemetering or communication functions. The smart meter protection system 100 decreases the intensity of the RF radiation being emitted by the smart meter 105 into the home. The smart meter protection system 100 also potentially prevents appliances/products/devices in one's home/structure from communicating with the smart meter 105.

In the embodiment of the smart meter protection system 100 shown with respect to FIGS. 1-23, the smart meter protection system 100 includes a smart meter protection device 110 and a smart meter protection panel 120, each of which will be described in turn below. In additional embodiments of the smart meter protection system, which are shown in FIGS. 24-31, the smart meter protection system includes a focuser unit 320 that surrounds a perimeter of the smart meter 105.

The smart meter protection device 110 has a rectangular box configuration housing with an open end 140. As shown best in FIG. 8, which is a top plan view of an exemplary panel layout of the smart meter protection device 110, the smart meter protection device 110 includes a main square panel 150, rectangular top/bottom panels 160, elongated rectangular flaps 170, elongated rectangular Velcro strips 175, end panel 180, and trapezoid flaps 190. The various panels of the smart meter protection device 110 are connected by hinge lines as shown. The four panels 150, 160, 180 form four closed sides of the rectangular box configuration housing. One of two open sides of the rectangular box configuration housing accommodates the smart meter 105 and the other of the two open sides allows redirected radiation to egress there through away from the interior of the building structure, living area, or where people frequent.

In an embodiment, the smart meter protection device 110 is made of an aluminum composite material (solid polyethylene core with two pre-painted sheets of aluminum or similar material) called Dibond, which is registered trademark of 3A Composites USA of Mooresville, N.C. In alternative embodiments, the smart meter protection device 110 is made of metal such as, but not limited to, copper, aluminum, lead, nickel, and iron. In alternative embodiments, shielding material other than Dibond is used. Holes 200 are provided in the end panel 180, top/bottom panels 160, and trapezoid flaps 190. Fasteners (e.g. bolts) 210 are used to fasten the panels of the smart meter protection device 110 together. A grounding wire 220 is attached to the end panel 180 for grounding the smart meter protection device 110.

Figure 8:
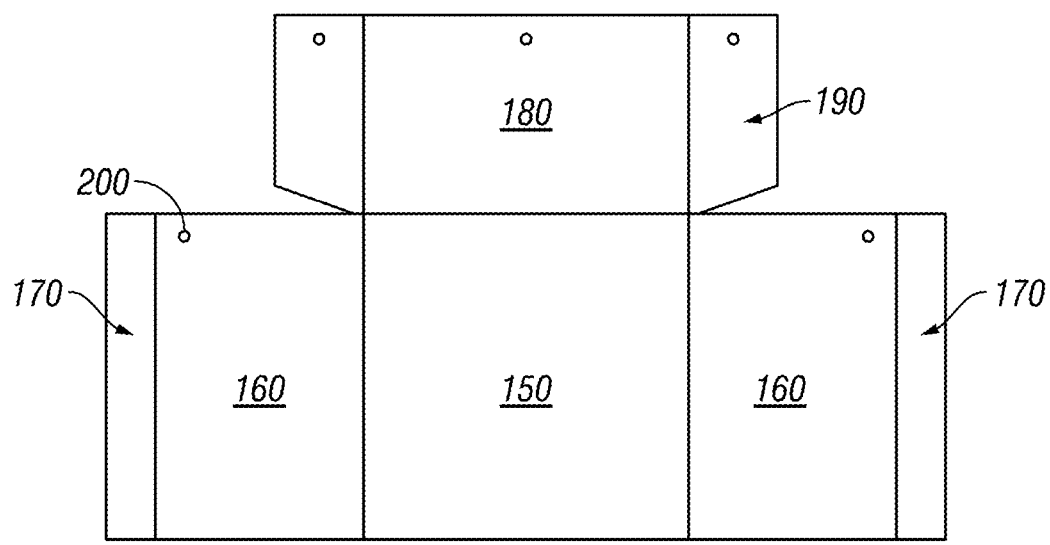
FIG. 8 is a top plan view of an exemplary panel layout of the smart meter protection device.

An exemplary method of making the smart meter protection device 110 includes receiving the smart meter protection device 110 as shown in FIG. 8; inserting rivets into the holes; cutting grounding wire to length; stripping wire at both ends; placing an eyelet over one side of the wire and pinching it on there; placing eyelet connected to wire on the outside of box and inserting a rivet going through eyelet into hole in box; placing looped side of Velcro (hook and loop fasteners) on the flaps as shown.

Figure 9:
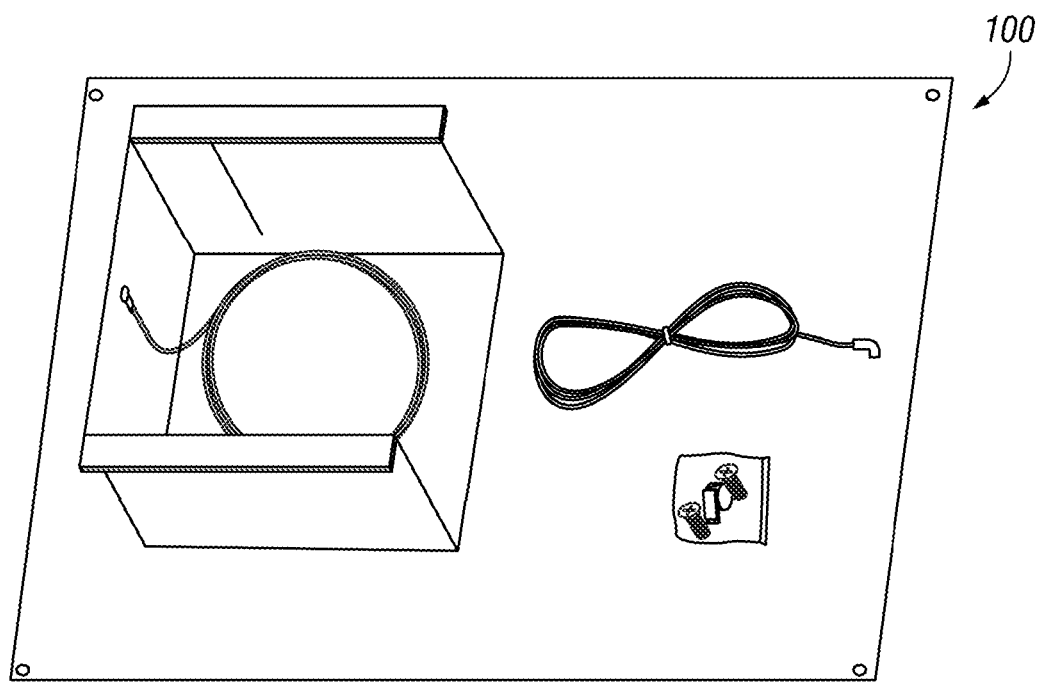
FIG. 9 is a perspective view of an embodiment of a smart meter protection system including the smart meter protection device illustrated in FIGS. 1-8.
Figure 10:
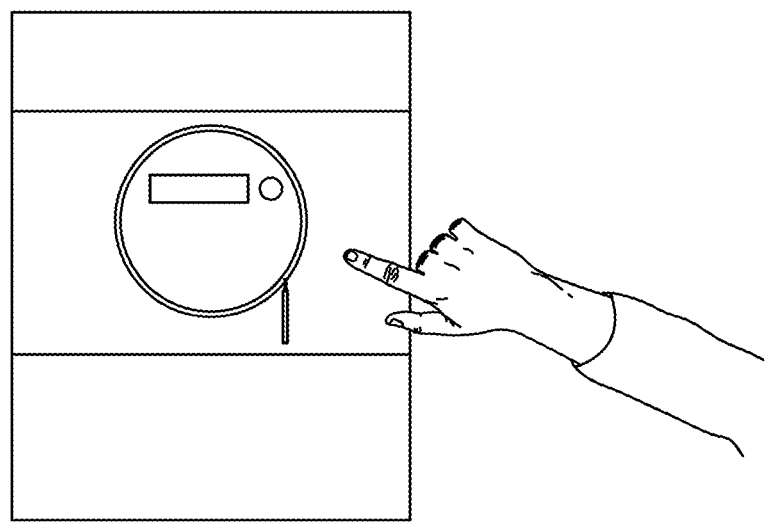
FIG. 10 is a front elevational view of an embodiment of a smart meter shown mounted outside a user's home.
Figure 11:
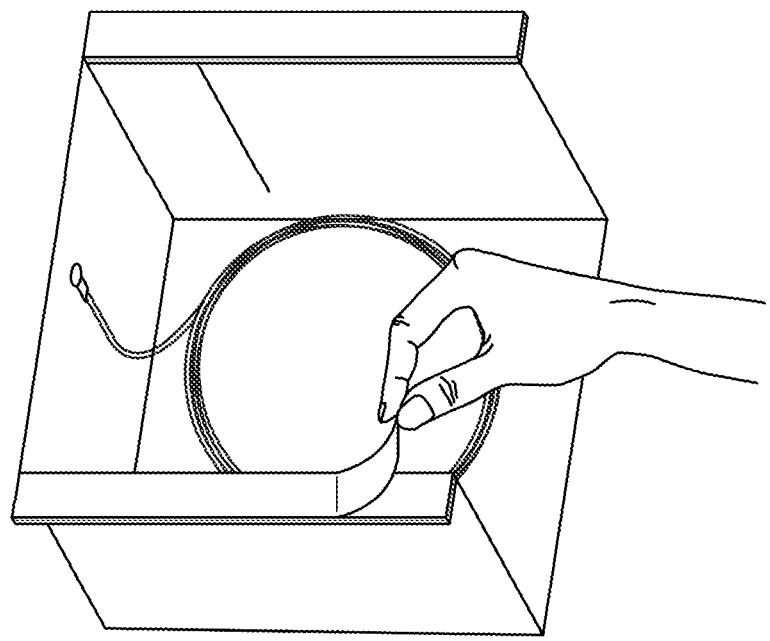
FIG. 11 is a perspective view of the smart meter protection device and illustrates the step of removing an adhesive strip from Velcro on the smart meter protection device.
Figure 12:
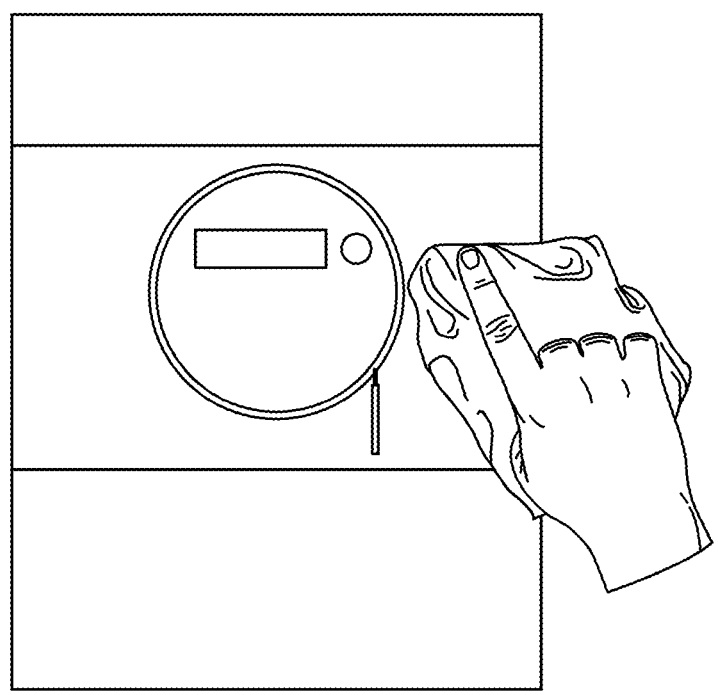
FIG. 12 is a front elevational view of the smart meter shown mounted outside a user's home and illustrates the step of making sure the surface of one's electrical box is clean prior to placing the Velcro on it.
Figure 13:
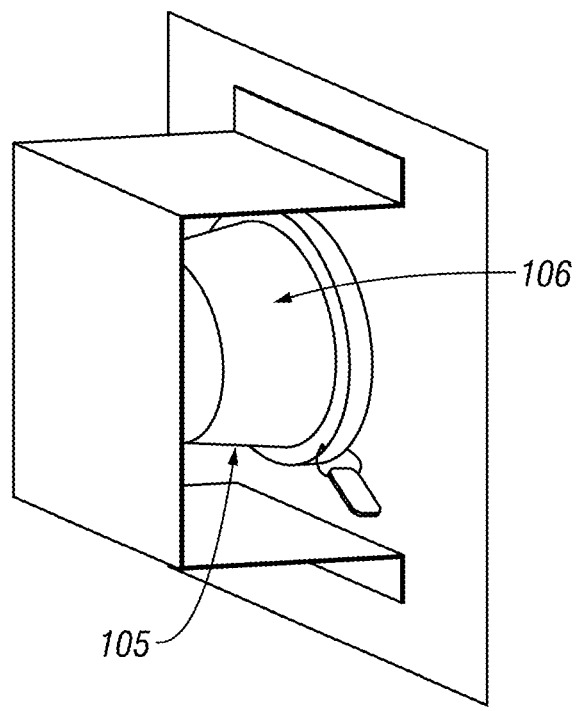
FIG. 13 is a perspective view showing the step of placing the smart meter protection device directly over the Smart Meter with open side facing away from one's home and family.
Figure 14:
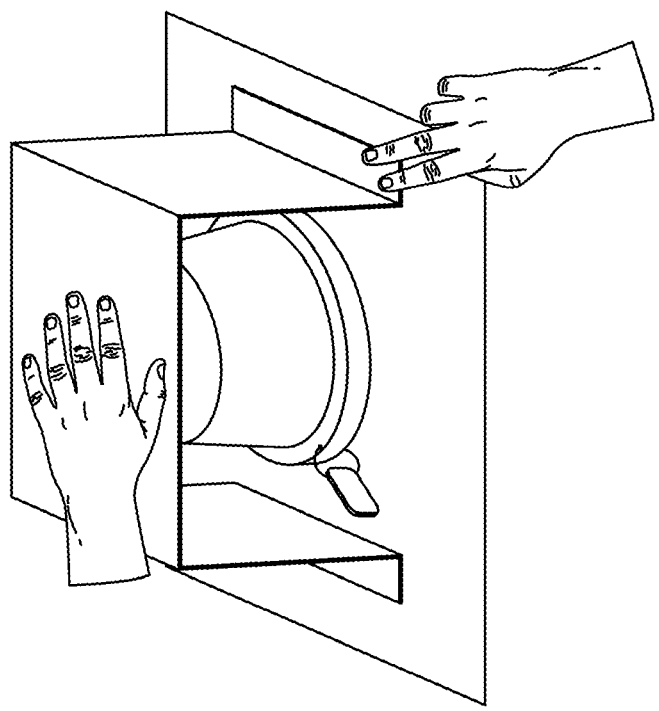
FIG. 14 is a perspective view showing the step of pushing firmly against electrical box to ensure the Velcro on the smart meter protection device is adhered properly.
Figure 15:
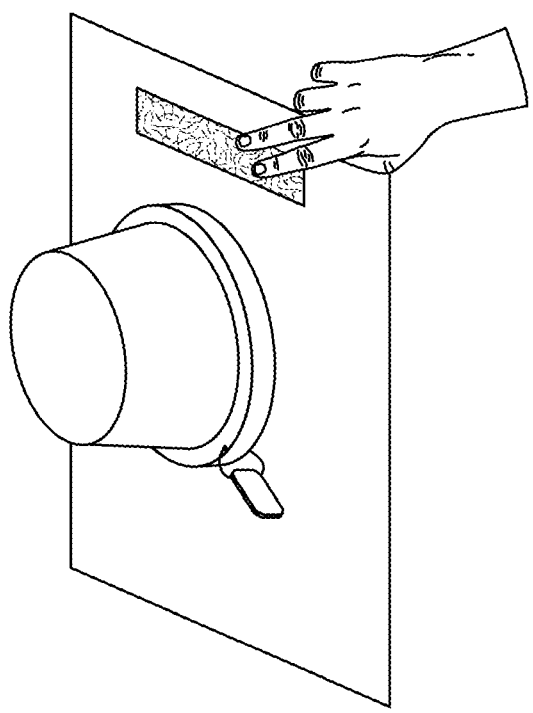
FIG. 15 is a perspective view showing the step of pulling the smart meter protection device off carefully and pressing the Velcro evenly throughout strip to ensure it stays on (the smart meter protection device may then be re-applied to the Velcro)
Figure 16:
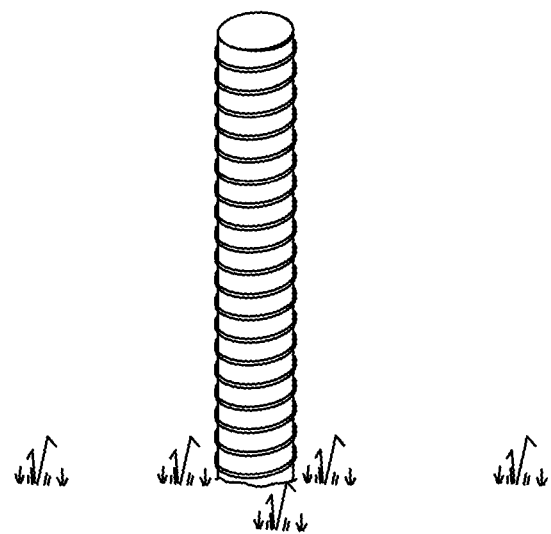
FIG. 16 is a perspective view showing an embodiment of a metal rod for grounding for the step inserting a metal rod into the ground for grounding (e.g., this could be rebar or copper pipe or a fastening to an existing pipe in ground or nearby water faucet)
Figure 17:
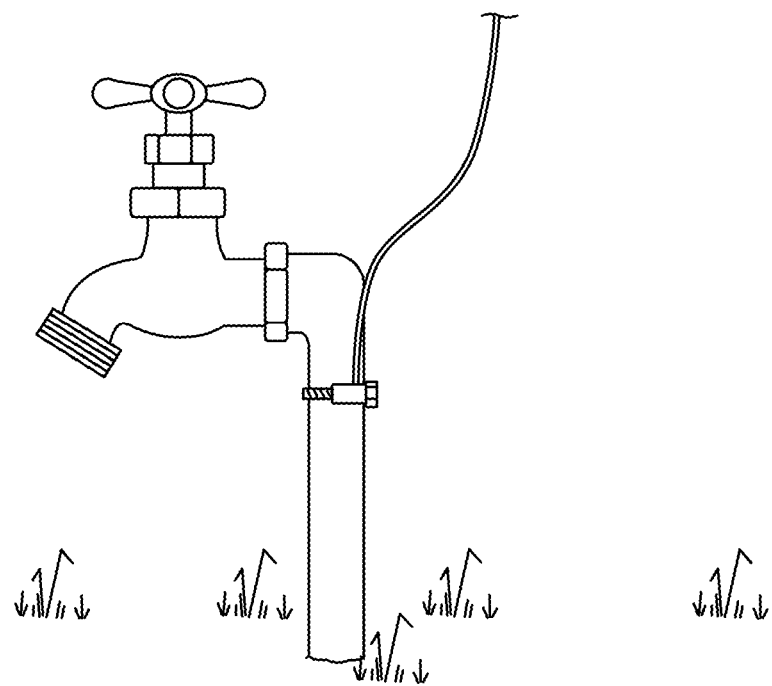
FIGS. 17 and 18 are perspective views showing, respectively, putting a grounding clamp on the metal rod and inserting the grounding wire into the side of the clamp and tightening.
Figure 18:
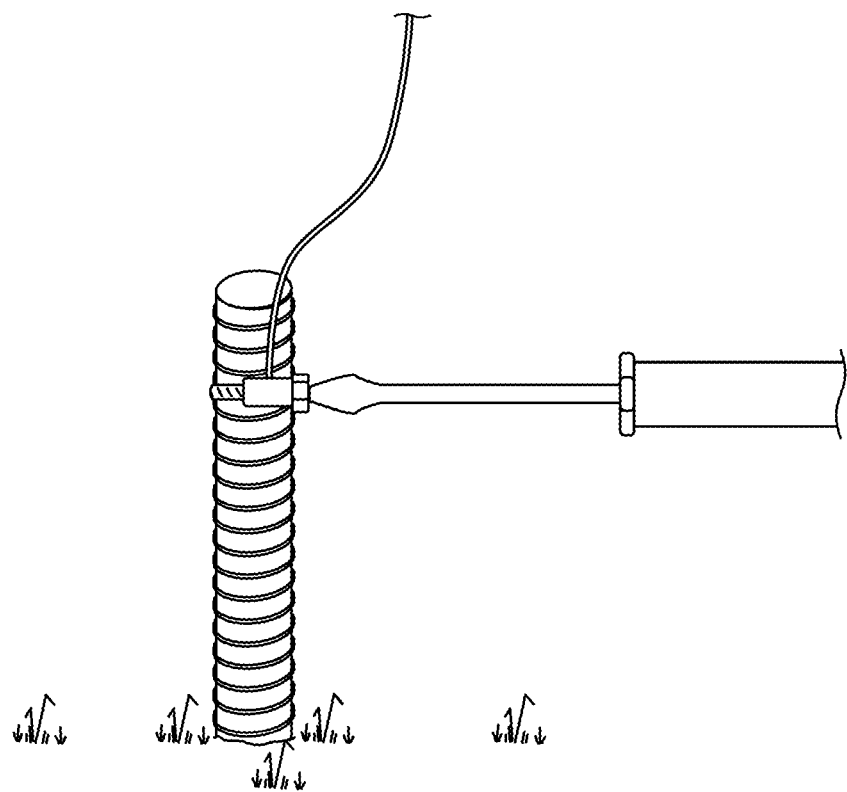
Figure 19:
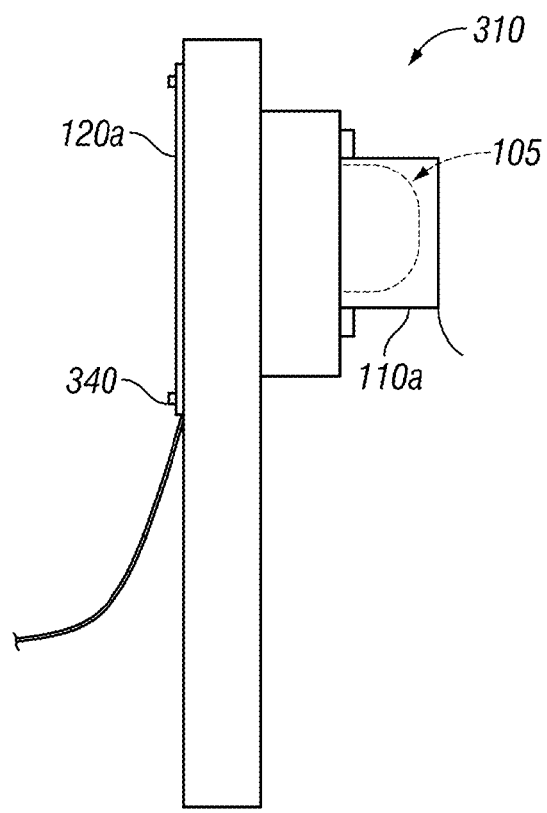
FIG. 19 is side elevational view of the smart meter protection system shown applied over a smart meter, and shows a smart meter protection panel of the smart meter protection system directly behind the smart meter on the inside (e.g., indoors) of the home, garage, or other structure.
Figure 20:
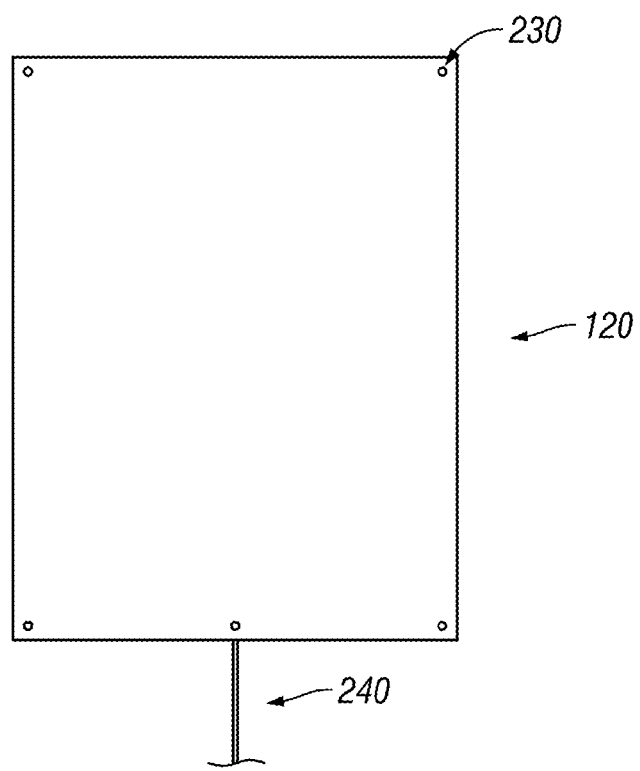
FIG. 20 is a front elevational view of an embodiment of the smart meter protection panel illustrated in FIG. 19.
Figure 21:
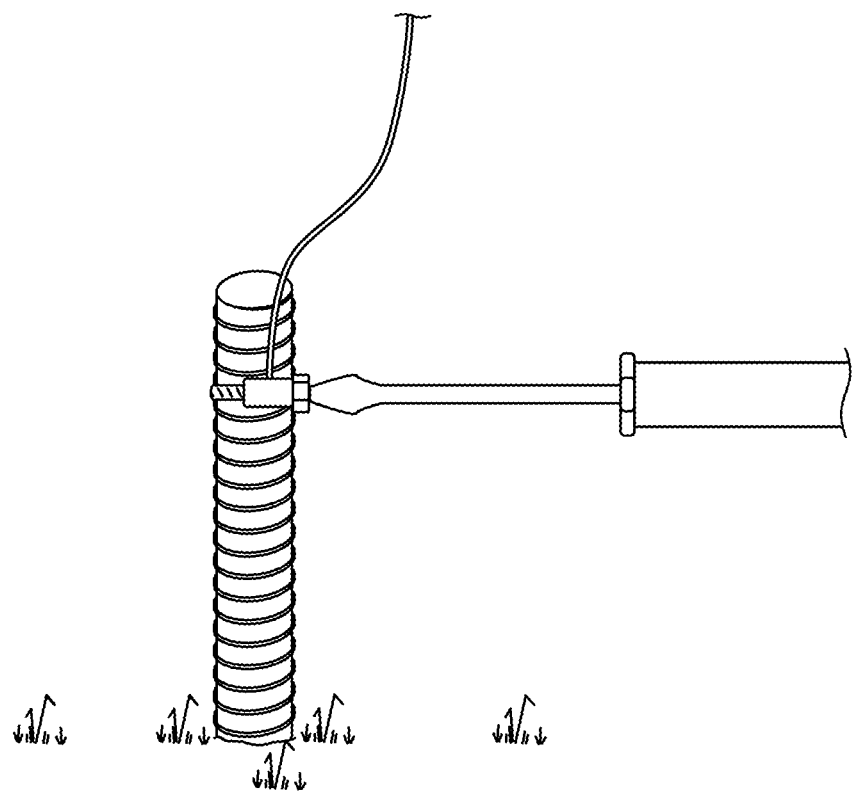
FIGS. 21 and 22 are a perspective view and a front elevational view, respectively, showing the step of grounding the wire of the smart meter protection panel to a grounded pole or a socket cover.

As shown in FIGS. 9, 19, and 20, the smart meter protection panel 120 is a substantially flat rectangular panel with holes 230 in the corners for attaching the smart meter protection panel 120 to an interior of a building structure, living area, or where people frequent (e.g., house, condo, apartment, commercial structure) to inhibit transmission of radiation/wireless signals through the smart meter protection panel 120. In an embodiment, the smart meter protection panel 120 is made of an aluminum composite material (solid polyethylene core with two pre-painted sheets of aluminum) called e-panel, which is trademark of 3A Composites USA of Mooresville, N.C. In alternative embodiments, the smart meter protection panel is made of metal such as, but not limited to, aluminum, nickel, iron, copper, and lead. In alternative embodiments, shielding material other than e-panel is used. A grounding wire 240 (FIGS. 19-23) is attached to the smart meter protection panel 120 for grounding the smart meter protection panel 120. FIG. 23 illustrates an embodiment of an attachment point (e.g., hole, bolt, washers, grommet) for attaching the grounding wire 240 to the protection panel 120.

An exemplary method of making the smart meter protection panel 120 includes receiving unit with pre-drilled holes; inserting a grommet in all 4 corner holes; cutting grounding wire to desired length; stripping wire on both ends; placing an eyelet over one side of wire and pinching it on there; placing eyelet connected to wire on hole and inserting rivet into eyelet and hole.

Figure 22:
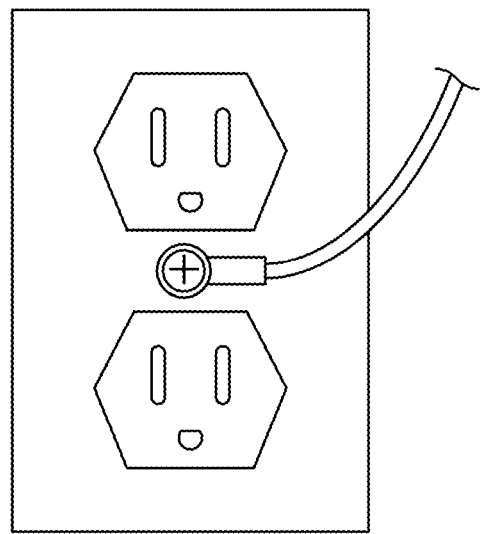
Figure 23:
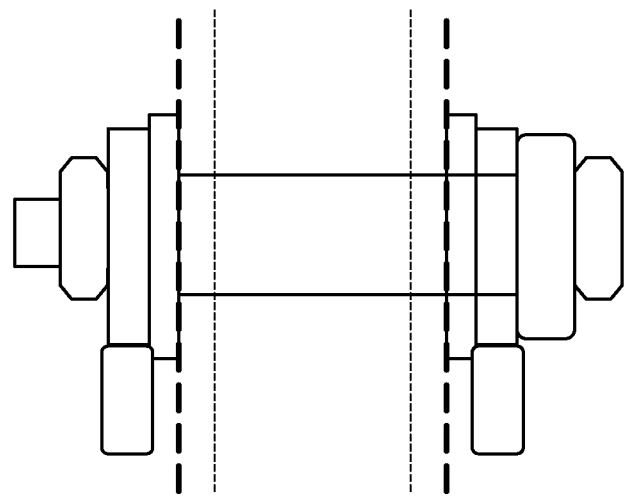
FIG. 23 is a partial cross-sectional view of an embodiment of an attachment point for attaching a grounding wire to the smart meter protection panel.

With reference to FIGS. 9-22, a method of applying the smart meter protection device 110 over a smart meter 105 includes unpacking the smart meter protection system 100 from box (FIG. 9), locating smart meter outside of home and the area directly behind it inside garage or home (FIG. 10); removing adhesive strip from Velcro (FIG. 11); making sure surface of electrical box is clean prior to placing the Velcro on it (FIG. 12); placing smart meter protection device 110 directly over the smart meter 105 with open side facing away from home and family (FIG. 13); pushing firmly against electrical box to ensure Velcro is adhered properly (FIG. 14); pulling smart meter protection device 110 off carefully and now pressing Velcro evenly throughout strip (FIG. 15) to ensure it stays on (smart meter protection device 110 may then be put back on); a grounding method such as inserting a metal rod into ground (FIG. 16) for grounding (this could be rebar or copper pipe or fasten to an existing pipe in ground or nearby water faucet); putting grounding clamp on the metal rod and inserting the grounding wire into the side of the clamp and tighten, making sure the copper contacts the clamp (FIGS. 17, 18); placing indoor smart meter protection panel 120 (FIGS. 19, 20) directly behind smart meter 105 and screwing it in with screws provided; a grounding method such as a grounding wire to a grounded pole outdoors (FIG. 21) or to the screw holding socket cover (FIG. 22).

In use, the smart meter protection device 110, which houses the smart meter 105, provides (along with the smart meter protection panel 120) a Faraday cage, Faraday shield or Hoffman Box for the smart meter 105. The smart meter protection system 100 redirects or absorbs the unwanted RF energy emitted by the smart meter 105, decreasing the intensity of the radiation going into one's home from the smart meter and protecting the occupants of the home from the majority of RF radiation emitted from the smart meter while allowing the smart meter to perform its telemetering or communication functions. The smart meter protection system 100 decreases the intensity of the RF radiation being emitted by the smart meter 105 into the home. The smart meter protection system 100 also potentially prevents appliances/products/devices in one's home/structure from communicating with the smart meter 105.

With reference to FIGS. 24-30, another embodiment of a smart meter protection system 310 will be described. The smart meter protection system 310, and methods of making, applying, and using the smart meter protection system 310 are generally similar to the smart meter protection system 100 and methods of making, applying, and using the smart meter protection system 100 described above with respect to FIGS. 1-23. Accordingly, the discussion and drawings with respect to FIGS. 1-23 is incorporated herein, and only the substantial differences between the smart meter protection systems 100, 310 and methods will be described/shown herein.

Figure 29:
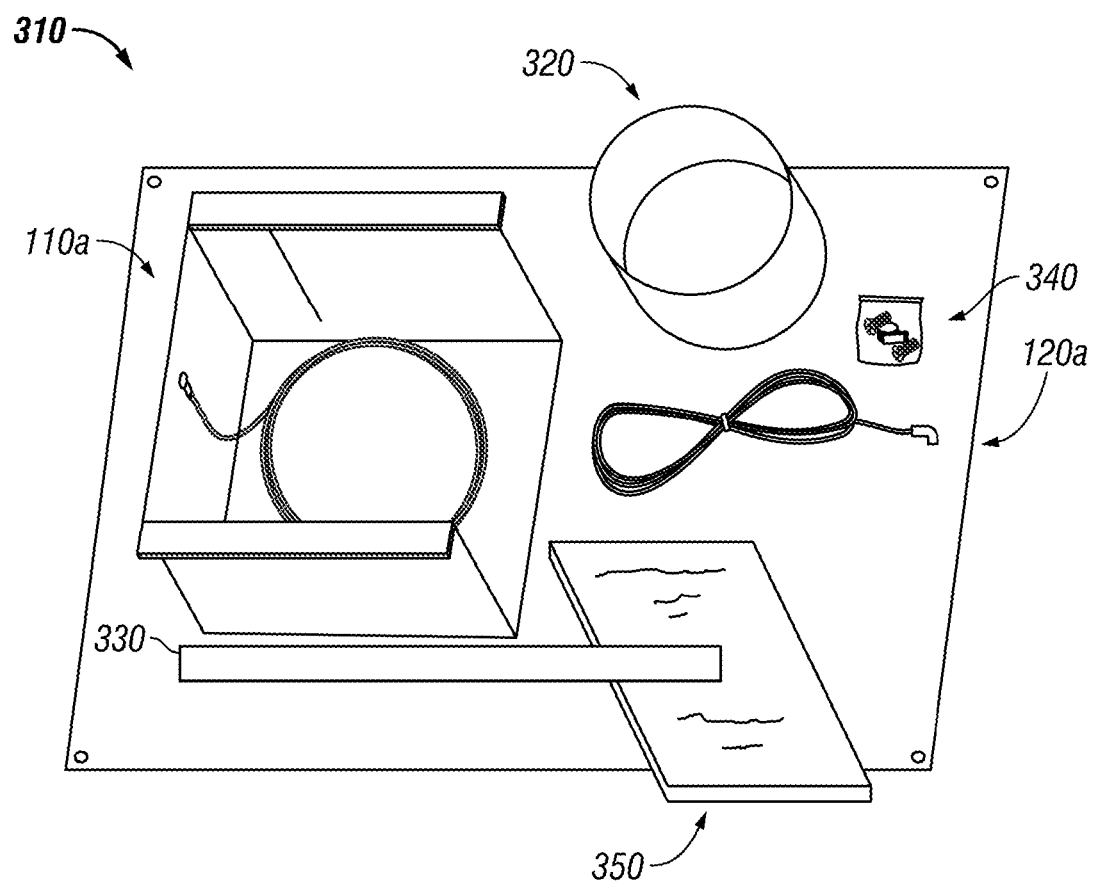
FIG. 29 is a perspective view of another embodiment of a smart meter protection system.

In the embodiment shown in FIG. 29, the smart meter protection system 310 includes a smart meter protection device (or directional unit) 110a, a smart meter protection panel (or ground plane) 120a, a focuser unit 320, a copper grounding rod 330, fasteners (e.g., grounding clamp, nails)

340, and an instruction manual 350. In alternative embodiments, the smart meter protection system 310 includes or does not include one or more of these components (e.g., does not include grounding rod, does not include instruction manual, does not include fasteners, only includes focuser unit).

Figure 24:
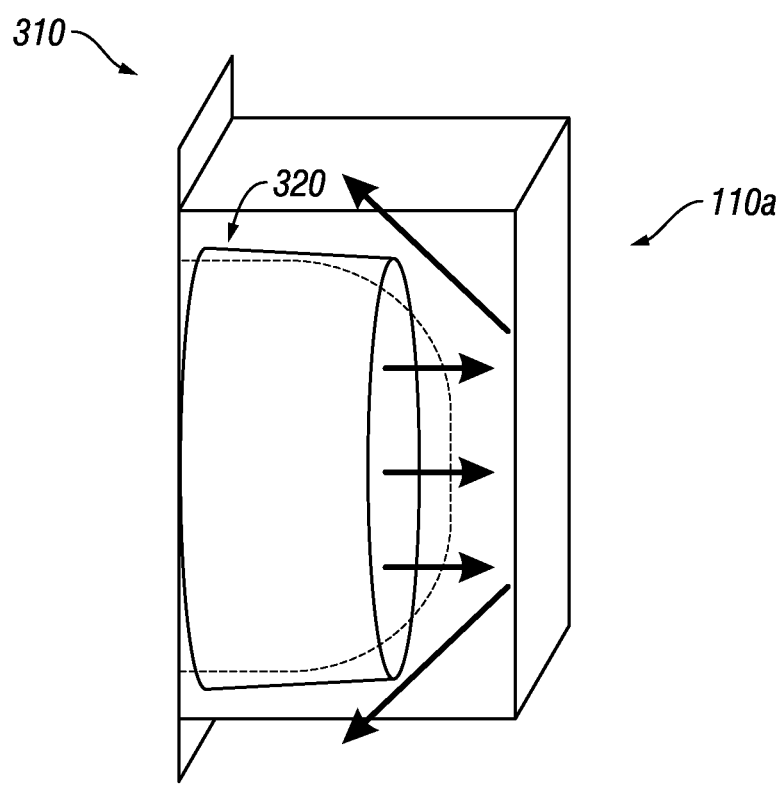
FIG. 24 is front perspective view of another embodiment of a smart meter protection device.
Figure 25:
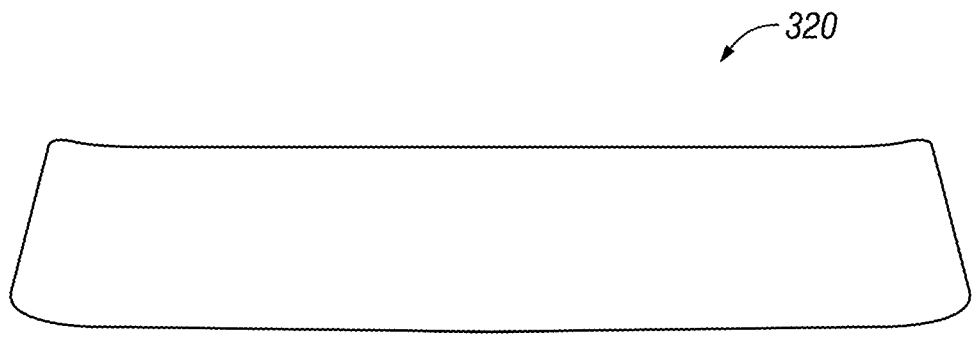
FIG. 25 is a front elevational view of an embodiment of an elongated piece of material that makes up a focuser unit of the smart meter protection device of FIG. 24.
Figure 26:
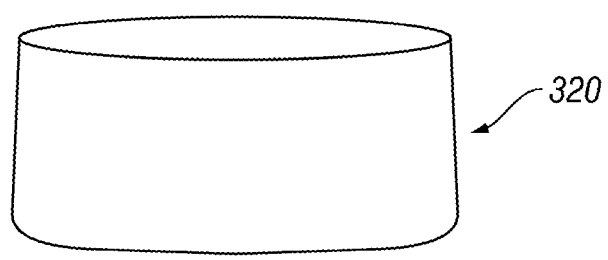
FIG. 26 is a front elevational view of the focuser unit of the smart meter protection device of FIG. 24.
Figure 27:
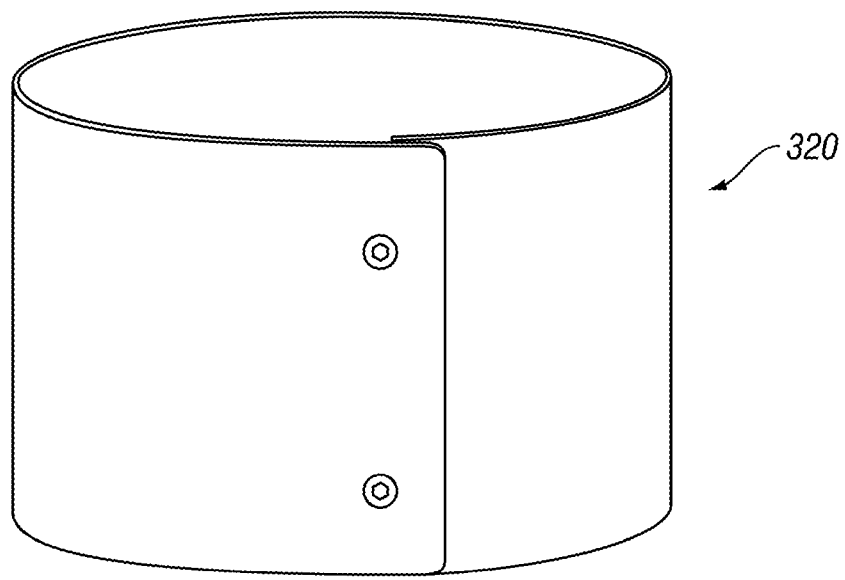
FIG. 27 is a front perspective view of the focuser unit of the smart meter protection device of FIG. 24.
Figure 28:
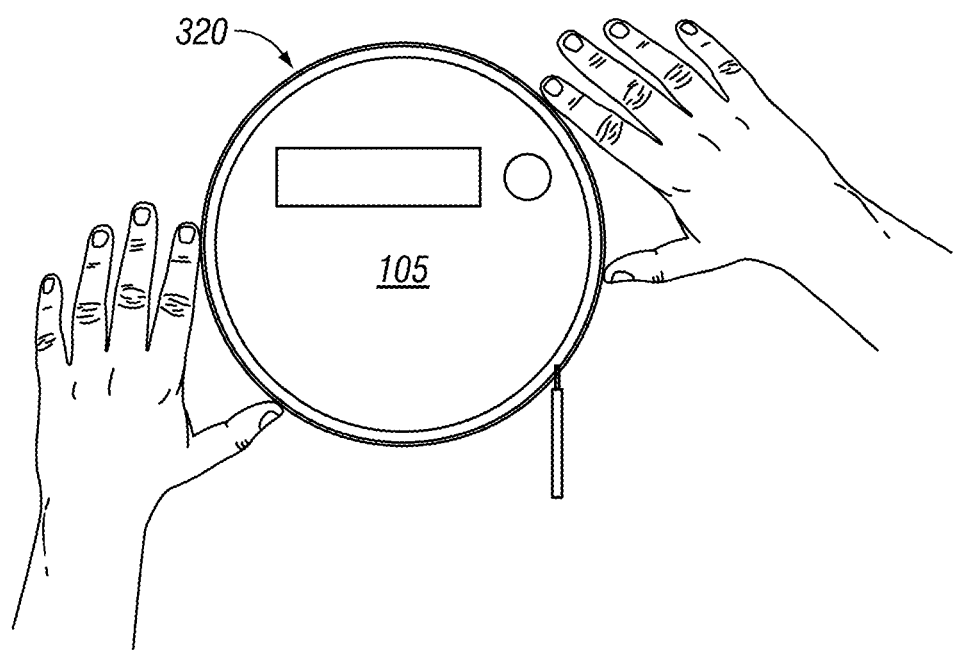
FIG. 28 is a front elevational view of the focuser unit shown applied circumferentially on the glass of a smart meter.

With reference to FIGS. 24, 27, and 28, the focuser unit 320 includes an aluminum annular band/cuff that circumferentially cuffs an outer ring-shaped periphery of the smart meter 105 in a ring-like fashion. The focuser unit 320 includes two open ends. One of the two open ends accommodates the smart meter 105 and the other of the two open ends allows redirected radiation to egress there through away from the interior of the building structure, living area, or where people frequent. The focuser unit 320 may include section cutouts to tune the smart meter 105 to the target/desired specific RF frequency. As shown in FIG. 28, the focuser unit 320 must be pushed back as far as possible over the smart meter 105. After the focuser unit 320 is applied over the smart meter 105, the smart meter protection device/directional unit 110a is applied over the smart meter 105 in the manner described/shown above with respect to FIGS. 9-22, which are incorporated herein by reference. The smart meter protection device/directional unit 110a should not touch the focuser unit 320 once installed.

The focuser unit 320 focuses RF emitted from the smart meter 105 towards an inside of the housing. The focused RF reflects off the inside of the housing and exits the smart meter protection device 110a through the open end. The focuser unit 320 helps to decrease the intensity of the RF radiation being emitted by the smart meter 105 into the home. The focuser unit 320 also prevents radio waves from other smart meters 105 from relaying data to the smart meter 105 when the focuser unit 320 is installed.

Figure 31:
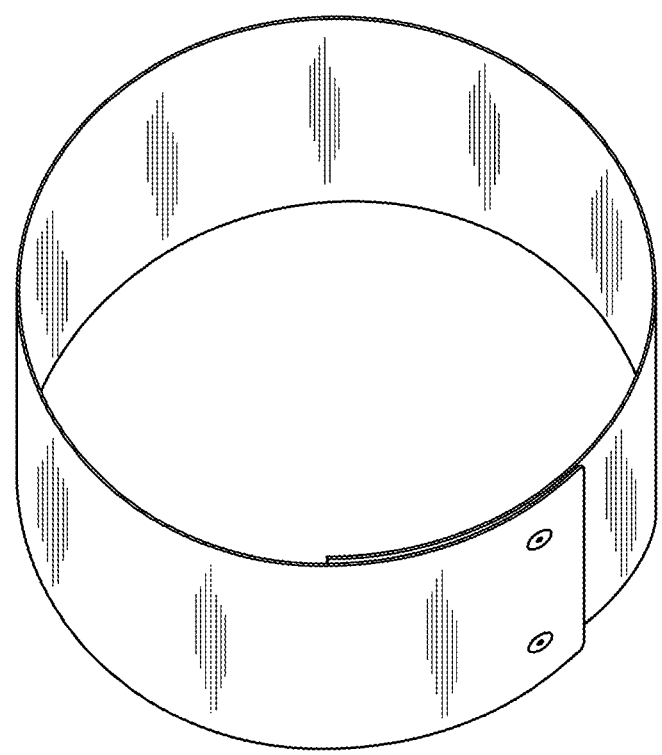
FIG. 31 is a front perspective view of another embodiment of a focuser unit similar to the focuser unit shown in the smart meter protection device of FIG. 24.

FIG. 31 illustrates another embodiment of a focuser unit that includes an annular band/cuff that circumferentially cuffs an outer ring-shaped periphery of the smart meter 105 in a ring-like fashion. The focuser unit of FIG. 31 may be combined with a smart meter protection device and/or a smart meter protection panel. In an alternative embodiment, the focuser unit circumferentially cuffs an outer ring-shaped periphery of the smart meter 105 in a ring-like fashion and is used alone with the smart meter 105, without the smart meter protection device/panel.

In this embodiment of the smart meter protection system 310, the smart meter protection device 110a, which is located outdoors during use, is made of an aluminum composite material (e.g., two layers: 1) polyethylene layer, 2) aluminum layer) or metal, and the smart meter protection panel 120a, which is located indoors during use, is made of an aluminum composite material or metal, and the focuser unit 320, which cuffs the smart meter 105 and is inside of the smart meter protection device 110a, is made of aluminum.

Figure 30:
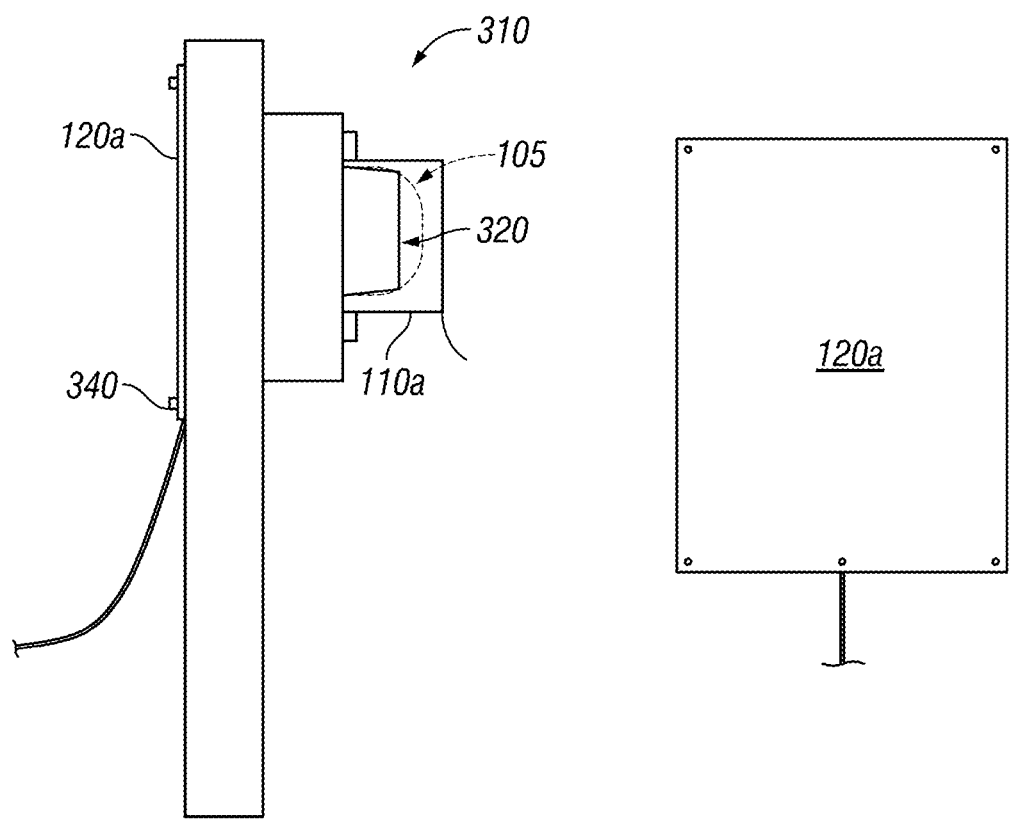
FIG. 30 is a perspective view of the smart meter protection system of FIG. 29 applied to a smart meter and a wall of a home.

As shown in FIG. 30, during installation of the smart meter protection system 310, the smart meter protection panel/ground plane 120a is placed on the opposite side (inner wall surface) of the wall from the smart meter 105 and nailed to the inner wall surface with nails 340.

An exemplary method of making an outdoor smart meter protection device/directional unit 110a includes cutting off a predetermined length of grounding; stripping both ends of the wire to expose a predetermine length at ends; placing/twisting/pushing on a ring terminal (eyelet) over each end; securing it on there using a wire crimper; squeezing at the top, just below the ring portion and then again directly below that; on routed Dibond pre-cut sheet, removing protective film from front and back of smaller shaped portion and halfway up front where grooves are and away from any pre-made holes (all of it can be removed but the film protects from scratches while constructing box); pushing one panel fastener/rivet through each of top holes of side flaps from smooth side toward the routed side using a hard surface; folding the smaller portion toward the larger portion and lining up the holes and pushing the panel fastener/rivet through the new hole as well; placing eyelet of ring terminal attached to the grounding wire flat side out onto the head/white portion of the rivet; placing a metal/steel flat washer up against flat side of eyelet/ring terminal onto rivet; placing rivet in center hole of the box from the outside (making sure wire goes to side of box not, straight down, and using "rivet clamper" to seal rivet); removing protective film from "wing flaps" portion of the box; taking Velcro strips and removing backing from "soft" side; placing on the flaps making sure that outer portions are straight and even (smoothing down to remove bubbles); removing all protective film prior to shipping;

An exemplary method of making an smart meter protection panel 120a includes cutting grounding wire to desired length; stripping both wires and both ends; placing an eyelet/ring terminal over both wires and pinching it on there; removing protective film over the holes; putting screw cover on screw; cutting nylon bushing up to first line; getting wire with eyelets; putting bushing through one eyelet and then through washer and then through hole lying flat against E-panel board; on opposite side, putting on washer then the other eyelet (keeping wire up/perpendicular to the edge of the board); putting screw through the bushing and fasten the nut on the opposite side (holding nut in place with the wrench while screwing in the screw); inserting a grommet into all 4 holes by squeezing them in; and removing rest of plastic film.

While various embodiments of the present invention have been described above, it should be understood that they have been presented by way of example only, and not of limitation. Likewise, the various drawings/diagrams may depict an example architectural or other configuration for the disclosure, which is done to aid in understanding the features and functionality that can be included in the disclosure. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present disclosure.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosure, whether or not such embodiments are described and whether or not such features are presented as being a part of a described embodiment. Thus the breadth and scope of the present invention, especially in any following claims, should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent.

As will become apparent to one of ordinary skill in the art after reading this document, the illustrated embodiments and their various alternatives can be implemented without confinement to the illustrated examples.

We claim:

1. A smart meter protection system for decreasing intensity of radiation going into an interior of a building structure, living area, or where people frequent from a smart meter, the smart meter having an outer surface area, comprising: a redirection mechanism operably associable with the smart meter to substantially enclose the outer surface area of the smart meter so as to redirect radiation emitted from the smart meter away from the interior of the building structure, living area, or where people frequent, wherein the redirection mechanism includes a smart meter protection device.

2. The smart meter protection system of claim 1, wherein the redirection mechanism includes at least one of a smart meter protection panel and a focuser unit.

3. The smart meter protection system of claim 1, wherein the smart meter protection device includes a rectangular box configuration.

4. The smart meter protection system of claim 3, wherein the smart meter protection device includes four closed sides and two open sides.

5. The smart meter protection system of claim 4, wherein one of the two open sides accommodates the smart meter and the other of the two open sides allows redirected radiation to egress there through away from the interior of the building structure, living area, or where people frequent.

6. The smart meter protection system of claim 1, wherein the smart meter protection device includes at least one opening that allows redirected radiation to egress there through away from the interior of the building structure, living area, or where people frequent.

7. The smart meter protection system of claim 1, wherein the redirection mechanism includes a smart meter protection device and a smart meter protection panel.

8. The smart meter protection system of claim 7, wherein the smart meter protection panel is operably associable with the smart meter between the smart meter and the interior of the building structure, living area, or where people frequent to redirect the radiation emitted from the smart meter away from the interior of the building structure, living area, or where people frequent.

9. The smart meter protection system of claim 1, wherein the redirection mechanism includes a smart meter protection device, a smart meter protection panel, and a focuser unit.

10. The smart meter protection system of claim 1, wherein the redirection mechanism includes a focuser unit.

11. The smart meter protection system of claim 10, wherein the redirection mechanism is a focuser unit.

12. The smart meter protection system of claim 10, wherein the smart meter includes an outer periphery and the focuser unit is a band that is operably associable with the smart meter for directly surrounding the outer periphery of the smart meter in a ring-like fashion.

13. The smart meter protection system of claim 12, the band includes two open ends, and one of the two open ends accommodates the smart meter and the other of the two open ends allows redirected radiation to egress there through away from the interior of the building structure, living area, or where people frequent.

14. The smart meter protection system of claim 10, wherein the focuser unit includes at least one opening that allows redirected radiation to egress there through away from the interior of the building structure, living area, or where people frequent.

15. The smart meter protection system of claim 1, wherein the smart meter protection system includes a grounding wire to ground the smart meter protection system.

16. A method of using a smart meter protection system for decreasing intensity of radiation going into an interior of a building structure, living area, or where people frequent from a smart meter, comprising:
    decreasing intensity of radiation going into one's home from the smart meter associated with the building structure, living area, or where people frequent, the smart meter having an outer surface area and the redirection mechanism includes a smart meter protection device, comprising:
        providing the smart meter protection system of claim 1;
        operably associating the smart meter protection device with the smart meter so that smart meter protection device substantially encloses the outer surface area of the smart meter; and
        redirecting radiation emitted from the smart meter away from the interior of the building structure, living area, or where people frequent with the smart meter protection device.

17. The method of claim 16, wherein the redirection mechanism includes a smart meter protection panel, and operably associating includes operably associating the smart meter protection panel with the smart meter between the smart meter and the interior of the building structure, living area, or where people frequent so that smart meter protection panel redirects the radiation emitted from the smart meter away from the interior of the building structure, living area, or where people frequent.

18. The method of claim 16, wherein the smart meter includes an outer periphery and the redirection mechanism includes a focuser unit that is a band, and operably associating includes directly surrounding the outer periphery of the smart meter in a ring-like fashion with the focuser unit so that the focuser unit substantially encloses the outer surface area of the smart meter and redirects radiation emitted from the smart meter away from the interior of the building structure, living area, or where people frequent.

* * * * *